United States Patent
Kim et al.

(10) Patent No.: US 6,670,816 B2
(45) Date of Patent: Dec. 30, 2003

(54) TEST COUPON FOR MEASURING A DIELECTRIC CONSTANT OF A MEMORY MODULE BOARD AND METHOD OF USE

(75) Inventors: Yong-Hyun Kim, Kyungki-do (KR); Sei-Gu Lee, Kyungki-do (KR); Joung-Rhang Lee, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/039,410

(22) Filed: Dec. 28, 2001

(65) Prior Publication Data

US 2002/0106822 A1 Aug. 8, 2002

(30) Foreign Application Priority Data

Dec. 29, 2000 (KR) .......................... 2000-85164

(51) Int. Cl.[7] .................. G01R 31/08; G01R 27/32; H05K 1/00; H01R 12/06
(52) U.S. Cl. ................ 324/535; 324/639; 324/663; 174/250; 174/262
(58) Field of Search .............. 324/719, 658, 324/663, 532, 535, 629, 539, 534, 533, 642, 763, 758, 158.1; 714/733, 734; 257/48; 361/306.3; 438/14, 17, 18; 174/250, 261, 262; 716/4, 5, 6

(56) References Cited

U.S. PATENT DOCUMENTS

| | | | | |
|---|---|---|---|---|
| 5,877,631 A | * | 3/1999 | Takahashi | 324/533 |
| 6,484,299 B1 | * | 11/2002 | Larsen | 716/6 |
| 6,521,841 B2 | * | 2/2003 | Kawaguchi | 174/250 |
| 2002/0075009 A1 | * | 6/2002 | Butler | 324/534 |
| 2003/0001587 A1 | * | 1/2003 | Arabi | 324/533 |

* cited by examiner

*Primary Examiner*—Anjan K. Deb
(74) *Attorney, Agent, or Firm*—Marger Johnson & McCollom, P.C.

(57) ABSTRACT

A test coupon for measuring a dielectric constant of a memory module substrate has a plurality of test pattern layers each having a long trace and a short trace formed thereon. A first test pattern layer has an exposed surface and a second test pattern layer is formed internally. The first test pattern layer has probe pads respectively connected to the long and short traces of the first and second pattern layers. Probe pads of the first test pattern layer are connected to a via contact of the second test pattern layer by via holes. The via contact of the second pattern layer is connected to the long and short traces of the second pattern layer. The test coupon is used to measure the dielectric constant of a module board.

20 Claims, 5 Drawing Sheets

TEST COUPON FOR MEASURING A DIELECTRIC CONSTANT OF A MEMORY MODULE BOARD AND METHOD OF USE

This application claims priority from Korean Patent Application No. 2000-85164, filed Dec. 29, 2000, the contents of which are incorporated herein by reference in their entirety.

BACKGROUND OF THE INVENTION

1. Technical Field of the Invention

This invention relates generally to technology for measuring a dielectric constant of a memory module. More particularly, this invention relates to a test coupon used to measure the dielectric constant of a Rambus Interface Memory Module (RIMM), as well as a method of using the test coupon.

2. Description of Related Art

In general, Rambus Dynamic Random Access Memory (RDRAM) is supplied in a Rambus Interface Memory Module (RIMM) that can include four to sixteen individual RDRAM devices. Using controlled-impedance transmission lines, Rambus memory systems are able to offer high bandwidth. To control the electrical and logical characteristics of these memory systems, the parameters of each system component (RIMM, motherboard, etc.) must be kept within a specified range. These parameters include impedance, propagation delay, propagation delay skew, and others. In particular, since the Rambus channel operates at high data rates of up to 800 million transfers/second, controlling high frequency properties, such as reflection and crosstalk is critical.

Propagation delay is an important parameter since the flight-time of the electrical signals must meet the maximum and minimum specifications for the system to function logically. The propagation delay of a RIMM is depends mainly on the wave velocity of the RIMM Printed Circuit Board (PCB) and on the capacitive loading of the surface-mounted RDRAM devices. In typical RIMMs, the bareboard PCB delay accounts for 60–90% of the total delay.

The PCB propagation delay is primarily a function of the dielectric laminate materials (Prepreg, core, etc.). Although RIMMs are manufactured with standard FR-4 materials, careful material selection and stack-up optimization is necessary in order to achieve the specified electrical impedance and propagation delay properties. The RDRAMs load the bare board PCB capacitively, increasing the total propagation time of the trace signal. Delay from the RDRAM devices increases as the mounting density of the RDRAM components on the PCB increases. Further, RIMMs will have higher propagation delay and lower impedance when built with RDRAMs with higher input capacitance. Conversely, RIMMs will have lower propagation delay and higher impedance when built with RDRAMs of lower input capacitance. Therefore, to maximize high volume production yield, the RDRAMs and PCBs should be optimized to meet both the impedance and propagation delay specifications when assembled as a module.

One method for measuring propagation delay is to measure propagation velocity. To determine the propagation velocity, and hence the propagation delay, the structure delay is determined by measuring the difference in time it takes for the pulse to propagate through the structure. Parameters related to the transmission time in RIMMs include the propagation delay Tpd and delay skew $\Delta$Tpd between each Rambus Signal Level (RSL).

FIGS. 1 and 2 illustrate a delay skew $\Delta$Tpd measurement method according to the prior art. Referring to FIG. 1, propagation velocity is measured using Time Domain Reflectometry (TDR) in a Time Domain Transmission (TDT) mode. A TDT mode test is performed by placing low capacitance, high impedance probes 6 and 8 at both launching and reflection points. A pulse 4 is applied to one end (the launching point) of a test coupon 2 with a 50-ohm probe 6 and a signal is captured at the other end (the reflection point) using a second probe 8. The advantage of the TDT mode over other TDR techniques is that the captured signal has propagated only once down the coupon, yielding an improved rise-time response. In the graph shown in FIG. 2, the x-axis represents time and the y-axis denotes a voltage level. By measuring the time difference $\Delta$T between the signal 10 input at the launching point and the signal 12 captured at the reflection point, the propagation delay and dielectric constant can be calculated.

FIG. 3 illustrates another conventional method for measuring propagation delay and velocity. Referring to FIG. 3, this method uses a dual-ported continuous impedance coupon. Using a vector network analyzer, the propagation delay is measured as a phase delay of a 400-MHz sine wave between two ports. This method yields the most accurate measurements in absolute time since the electrical length is fixed and reflections are minimal due to the continuous impedance of the trace. This diagnostic coupon may be placed on the side-panels of a typical RIMM module panel.

Unfortunately, however, due to limitations on the main time scale of the currently available TDR measuring instruments, the prior art test methods shown in FIGS. 1–3 cannot ensure a reliable and precise measurement. It is therefore impossible to determine either the exact launch edge or the exact reflected wave edge. The uncertainty in identifying these edges is a major obstacle to accurately measuring propagation delay by TDR. For example, as shown in FIG. 2, displaying the launching and reflection points on one screen of the measuring instrument makes it difficult to locate the true launching and reflection points, which are the references used to measure the propagation delay. The measured propagation delay Tpd value may therefore be erroneous because it is based on inaccurate launching and reflection points. As a result, in conventional propagation delay measurement methods, the precise dielectric constant of a RIMM PCB, and thus the properties of the PCB, are difficult to know, and controlling variations in properties of the board itself is difficult.

Moreover, since the device specification requirement is more stringent than that for a clock, and requires a delay skew $\Delta$Tpd within the range of $\pm$10 ps, it is difficult to precisely estimate and manage the delay skew $\Delta$Tpd. Some reasons for this difficulty include the fact that the parameters affecting the delay skew $\Delta$Tpd of a RIMM vary depending on properties of the module PCB and mounted RDRAMs, on the interoperation when combining the RDRAMs with the PCB, and on errors in the manufacturing process.

In order to make delay skew $\Delta$Tpd more consistent, RSL traces each having the same length can be used to make the propagation delays of the traces more similar. This is not sufficient, however, because even if the total lengths of the traces are identical, each of the RSL traces may still exhibit different properties due to asymmetrical structures used in forming the traces. The individual RDRAMs mounted on the PCB may also have slightly different properties depending on their pins.

Furthermore, because of manufacturing inconsistencies, the impedance and the propagation delay of the PCB trace may vary among products and may even vary among traces in the same product. This can lead to variation in the operational characteristics within a given range. All of these factors can change the channel delay. Although the amount of variance due to these factors is relatively small and may not be a serious problem in light of the overall propagation delay, this variance can cause a significant problem with respect to the accuracy of the delay skew $\Delta$Tpd measurements. The properties of each RDRAM component and PCB should therefore be assured in order to control the properties of the mounted RIMMs. The existing RIMM PCB design, however, cannot provide precise measurement because of a via effect and a bending effect of each signal.

SUMMARY OF THE INVENTION

An object of the present invention is to provide a method of measuring a dielectric constant of a PCB that can precisely measure the properties of a produced memory module, and control, based on the measured data, the properties of a PCB.

Another object of the present invention is to provide a test coupon for use in the method of measuring a dielectric constant.

Another object of this invention is to provide a cost-effective way to measure the properties of a memory module PCB using existing measurement instruments.

A still further object of this invention is to assure consistent and predictable RIMM properties.

A test coupon comprising a plurality of test pattern layers can be used to measure signal propagation properties of a memory module board. The test pattern layers include a first test pattern layer having an exposed surface and a second test pattern layer formed internally. A dielectric layer and a ground layer are stacked between the first and second test pattern layers. Each of the test pattern layers includes a long trace and a short trace. The short trace preferably has a length of at least about 50 mm. A difference in length between the long trace and the short trace is preferably greater than about 100 mm. The first test pattern layer has a first pair of probe pads, where each pad is connected to a respective one of the traces of the first test pattern layer. The first test pattern layer also includes a ground pad configured to be connected to a ground voltage, and a second pair of probe pads, each pad connected to a respective one of the traces formed in the second test pattern layer. The second test pattern layer preferably includes a via contact electrically interconnected to the long and short traces of the test pattern layer. The second pair of probe pads of the first test pattern layer are connected to the via contact of the second test pattern layer by via holes.

A method of measuring a dielectric constant of a memory module board includes preparing a test coupon comprising a first test pattern layer and a second pattern layer. Said first pattern layer includes a first pair of probe pads each connected to a long trace or a short trace, respectively. A ground pad and a second pair of probe pads are also included in the first pattern layer. Each of the probe pads in the second pair is also connected to a respective long trace or short trace formed in the second test pattern layer. Said second pattern layer has a via contact electrically interconnected to the second pair of probe pads and the long and short traces.

A probe tip of a measurement instrument is connected to the traces of the test coupon. A time scale and vertical scale of the measurement instrument is adjusted. A signal waveform is read by applying an input signal to the traces through the probe tip. A propagation delay Tpd of the signal is then measured and an impedance value of the traces is confirmed by moving a first cursor. A second propagation delay Tpd value is then measured by moving a second cursor to a point higher by a predetermined value than an impedance value of the first cursor. A propagation delay Tpd deviation is calculated according to pattern layers in the test coupon on the basis of the measured propagation delay Tpd values for the long and short traces. A dielectric constant of each pattern layer is then calculated using the calculated propagation delay Tpd deviation value. The dielectric constant is calculated using the formula dielectric constant=[(Tpd·29.8)/length], where 'length' represents a propagation delay Tpd deviation in the long and short traces.

BRIEF DESCRIPTION OF THE INVENTION

The foregoing and other features and advantages of the present invention will be more clearly understood from the following detailed description of preferred embodiments thereof, made with reference to the accompanying drawings, which are not necessarily to scale, and wherein.

DETAILED DESCRIPTION OF PREFERRED EMBODIMENTS

Figure 1:
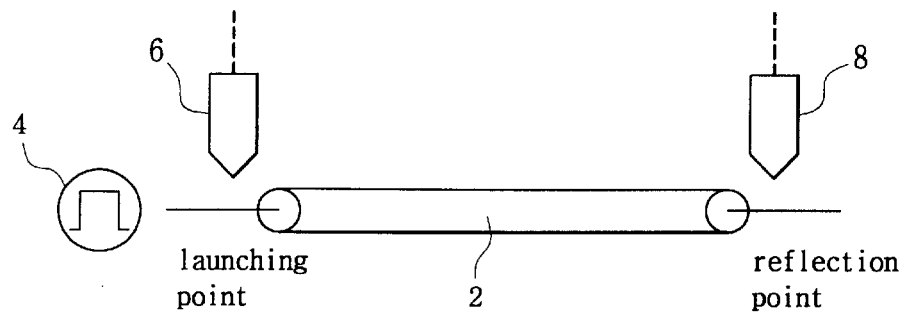
FIGS. 1 and 2 illustrate a conventional method for measuring a $\Delta$Tpd.
Figure 2:
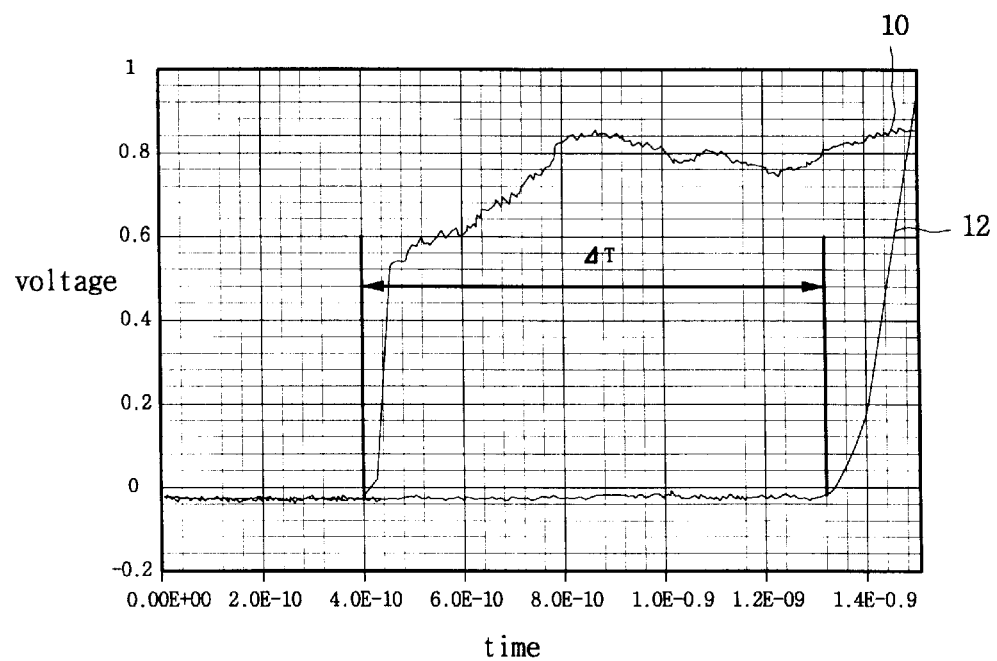
Figure 3:
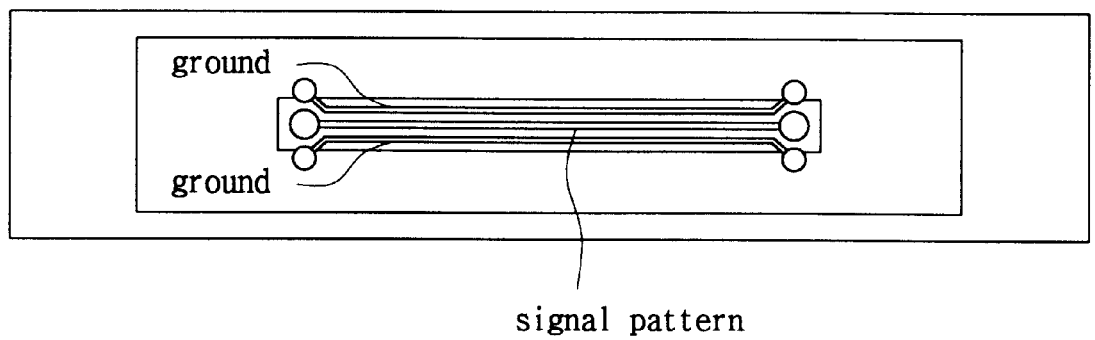
FIG. 3 illustrates a conventional dual-ported continuous impedance test coupon for measuring a propagation delay using a vector network analyzer.

The Rambus channel is based on a very high-speed, chip-to-chip interface that transfers data on each rising or falling edge of a 400 MHz differential clock. The data, clock, and control lines have a logic level of 800 mV that must meet stringent timing requirements. These are some of the analog characteristics that make up the Rambus Signaling Level (RSL) environment. Generally, a Rambus channel is made up of thirty (30) controlled-impedance matched transmission lines, where two 9-bit wide data buses, a 3-bit wide row bus, a 5-bit wide column bus and a clock bus are included.

Applicants have analyzed the RSL channels by modeling and transforming the channels, and studied the effects of trace impedance, dielectric constant, and RLC variation of RDRAMs on propagation delay skew $\Delta$Tpd. Applicants have also studied the relationship between propagation delay Tpd and bending of the trace and via. By doing so, applicants have found that the via has a greater effect on propagation delay skew $\Delta$Tpd than the bending of a trace. This factor should therefore be considered in designing RIMM PCBs. Further, even though parameters such as trace impedance, dielectric constant, and RLC variation of RDRAMs may not vary significantly enough to violate the RIMM specification, excessive propagation delay skew $\Delta$Tpd may still cause the specification not be met. It is therefore necessary to stringently control each of these parameters during the design and manufacturing processes.

To control these parameters, precise measurement of the electrical properties, and in particular the dielectric constant of the RIMM PCB itself, is important. It is especially important to obtain dielectric constant data corresponding to the PCBs that are actually produced while employing existing measuring instruments so as not to require additional facility investment.

FIGS. 4a – 4d are plan views of a propagation velocity test coupon according to a preferred embodiment of the present invention. In the production of a PCB, a work panel consisting of a predetermined number of individual module boards (also, referred to as 'piece') is prepared. A single work panel may include thirty (30) pieces, for example. The manufacturer of memory modules prepares individual module boards by separating the work panel. According to this embodiment of the present invention four test coupons are formed on one work panel. Although the position of the test coupons in the work panel is not limited to any specific locations, one of the coupons is generally disposed in the center of the work panel with generally more than two coupons arranged in peripheral areas of the work panel.

Referring to FIGS. 4a –4d, the test coupon 20 of the present invention has a stacked structure including a plurality of test pattern layers 20a, 20b, 20c, 20d. An insulating layer and a ground layer are interposed between each adjacent pair of test pattern layers. Each of the test pattern layers is formed of the same material as the signal pattern layer of the PCB (e.g., aluminum) and the insulating layer is made of material identical to dielectric layer used in manufacturing the PCB. The test coupon 20 is made during the PCB manufacturing process and each of the test pattern layers is formed at the same time the signal pattern layers are formed during the PCB manufacturing process. Accordingly, the values measured using the test coupon 20 reflect the actual characteristics of the produced PCB.

Figure 4A:
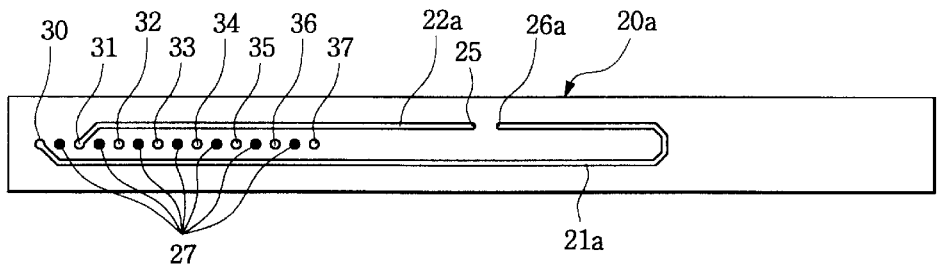
FIGS. 4a through 4d are plan views of a propagation velocity test coupon according to one embodiment of the present invention.
Figure 4B:
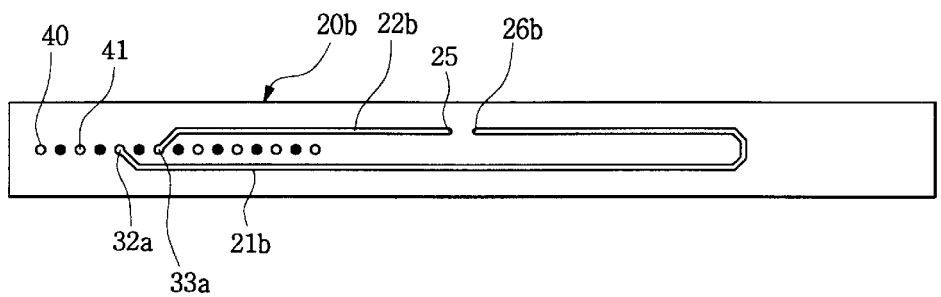
Figure 4C:
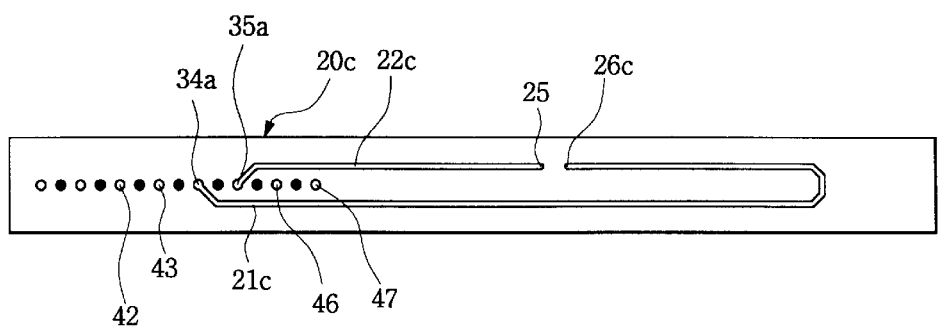
Figure 4D:
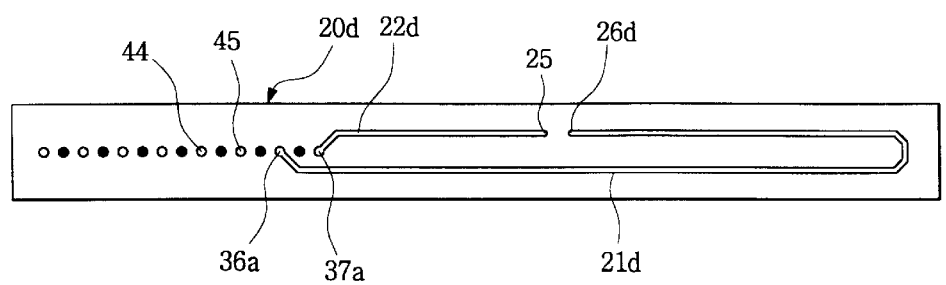

Referring specifically to FIG. 4a, the first test pattern layer 20a is located on a first layer. The second test pattern layer 20b, shown in FIG. 4b, is located at a third layer. The third test pattern layer 20c of FIG. 4c is located at a fifth layer, and a fourth test pattern layer 20d, of FIG. 4d, is located at a seventh layer. The remaining Layers 2, 4, 6 are ground layers. The number of layers is determined by the stacking order of the layers in the individual module board (or work panel). For example, the first test pattern layer 20a, located at the first layer, corresponds to the signal pattern layer at the top of the module board and directly contacts a test probe.

Each of the test pattern layers 20a–20d comprises a long trace 21a–21d and a short trace 22a–22d. The difference between the length of the long traces 21 and short traces 22 is preferably greater than about 100 mm, and each short trace 22 is preferably longer than about 50 mm. For example, in this particular embodiment, the length of each of the long traces 21 is about 280.55 mm and the length of each of the short trace 22 is about 76.73 mm. The selection of the precise trace dimensions depends, for instance, on limitations of the measuring instruments available. In general, however, if the length of the short trace is less than about 50 mm, errors between actual and measured values of propagation delay Tpd and impedance may be too great to guarantee the accuracy of the measured value. Similarly, when the difference in length of the test coupon traces is less than 100 mm, the measured propagation delay Tpd and impedance values generally cannot be regarded as accurate.

According to this embodiment, the first test pattern layer 20a includes a first pair of probe pads 30, 31, a second pair of probe pads 32, 33, a third pair of probe pads 34, 35, a fourth pair of probe pads 36, 37, and a ground pad 27. The second, third, and fourth test pattern layers 20b, 20c, 20d are internal layers. Long traces 21b, 21c, 21d comprise via contacts 32a, 34a, 36a and short traces 22b, 22c, 22d comprise via contacts 33a, 35a, 37a.

The probe pads 30, 31 of first pair of are respectively connected to the long and short traces 21a, 22a of the first test pattern layer 20a. The probe pads 32, 33 of second pair of the first test pattern layer 20a are respectively connected to via contacts 32a, 33a of the second test pattern layer 20b through the second vias 42, 43. The probe pads 34, 35 of the third pair of probe pads of the first test pattern layer 20a are respectively connected to via contacts 34a, 35a of the third test pattern layer 20c through the third vias 44, 45. The probe pads 36, 37 of fourth pair of the first test pattern layer 20a are respectively connected to via contacts 36a, 37a of the fourth test pattern layer 20d through the fourth vias 46, 47. The via holes 40–47 each penetrate from the first test pattern layer 20a to the fourth test pattern layer 20d, because all of the via holes are formed concurrently in a single via forming process.

The First Layer

Figure 5:
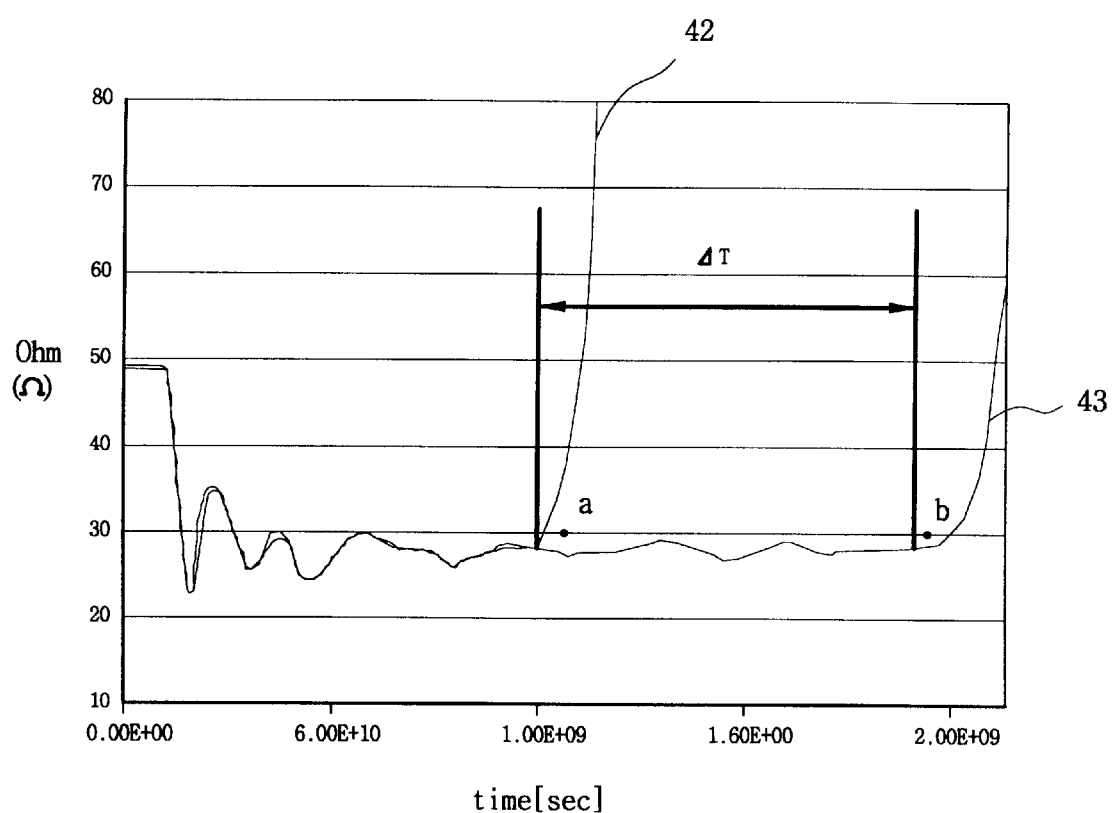
FIG. 5 shows a waveform of a measured signal with a test coupon and TDR (Time Domain Reflectometry)

A waveform is obtained by using TDR to capture a signal from a probe pad after providing a pulse into the test coupon 20. The waveform shown in FIG. 5, for example, is obtained by connecting the probe pads 32, 33 of the second pair to the ground pad 27 to measure the dielectric constant of the second pattern layer 20a. Referring to FIG. 5, the x-axis represents the time and the y-axis corresponds to impedance. A first waveform 42 represents the signal of the short trace 22. The other waveform 43 represents the signal of the long trace 21. The dielectric constant of each pattern layer of a PCB can be determined by measuring propagation time difference $\Delta T$ between the long and short traces 21 and 22. The propagation time difference $\Delta T$ can be represented as shown in Formula 1 (where V represents the propagation velocity and L represents the length of the trace):

$$\Delta T = 2L/V \qquad \text{(Formula 1)}$$

Rearranging the variables in Formula 1, the propagation velocity V is represented by Formula 2:

$$V = 2L/\Delta T \qquad \text{(Formula 2)}$$

The relationship between the propagation velocity of a signal and a dielectric constant can be represented by Formula 3 (where C represents the velocity of light and $\in\gamma$ represents the dielectric constant):

$$V = C/\in\gamma \qquad \text{(Formula 3)}$$

Using Formula 2 and Formula 3, the dielectric constant $\in\gamma$ can be represented by:

$$\in\gamma = C\Delta T/(2L); \text{ or} \qquad \text{(Formula 4a)}$$

$$\in\gamma = [C\Delta T/(2L)]2 \qquad \text{(Formula 4b)}$$

The generalization of Formula 4b yields Formula 5 (where 'length' is the propagation delay Tpd deviation of long and short traces):

$$\text{Dielectric Constant } \in\gamma = [(\text{Tpd} \cdot 29.98)/\text{length}]2 \qquad \text{(Formula 5)}$$

Figure 6:
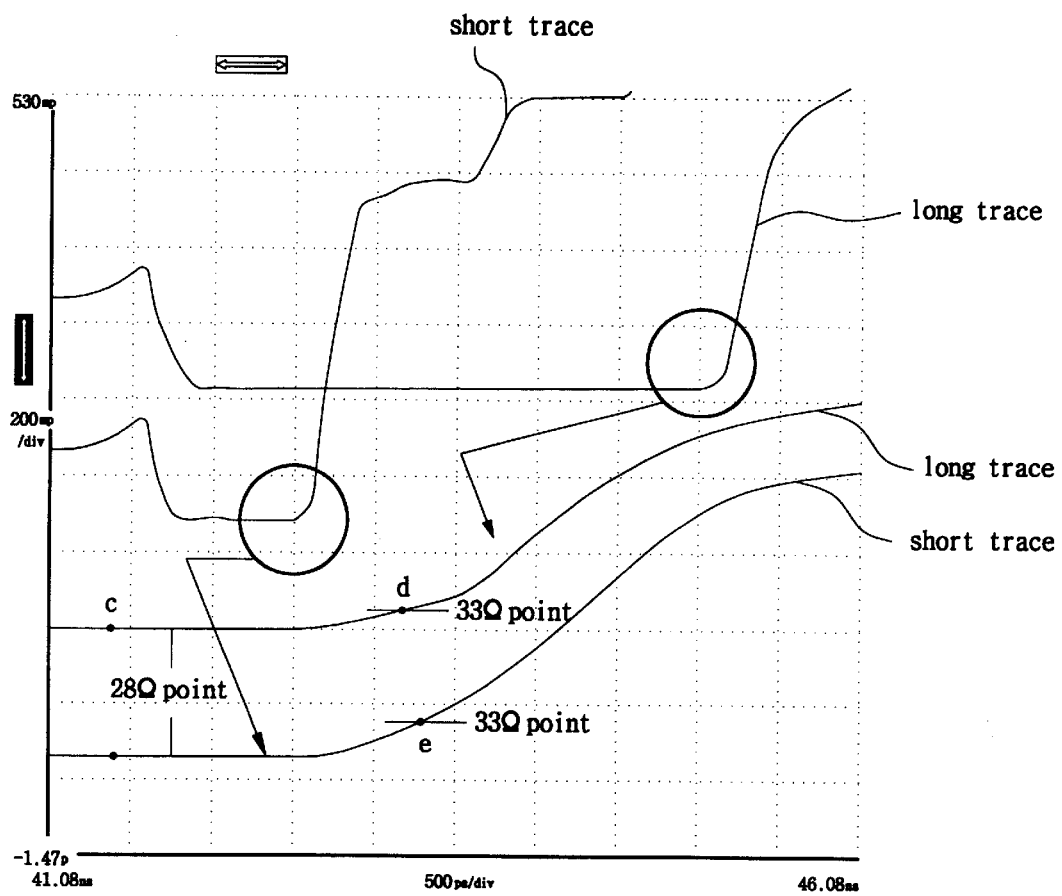
FIG. 6 is a waveform for illustrating measurement process of $\Delta$Tpd using a test coupon of the present invention.

Referring now to FIG. 6, a propagation delay Tpd measurement by TDR probing the long and short traces will be explained. In this particular example, a Tektronix TEK 11801 measurement instrument is used as a digital sampling oscilloscope and a Tektronix TEK SD-24 instrument is used as a TDR sample head. The signal cable is 50-ohm cable and the probe tips are 206-0398-00 standard probes.

Measurement of Long Trace

The method of measuring a long trace will now be described. First, a RIMM test coupon to be measured is prepared. A probe tip is placed on a probe pad of the long trace of the test coupon (see FIG. 4a). The time scale position and propagation delay Tpd measurement points are thereby set. The main time scale of the measuring instrument is set to 500 ps/div and the vertical scale is adjusted to 200 mp/div. More particularly, while adjusting the time scale so that the open waveform of the long trace can be displayed, the main time scale is moved in about 100 ps increments until the time scale is finally set to be 500 ps/div. At this time, the open waveform of the long trace should be displayed together with the 28-ohm line along a time scale of 500 ps/div.

When the waveform is displayed after completing the time scale position setting, the propagation delay Tpd measurement is started. The probe tip is placed on the long trace of the test coupon to begin the measurement. The waveform average control is switched from "off" to "on" after placement of the probe tip. At this time, an average thirty-two (32) count goes from 0 to 31. When the thirty-two count is completed, the waveform stop button is pushed. This manual probing measurement requires technical skill since operators or test engineers must check the waveform variation status before stopping the waveform.

The cursor on the screen is pressed to change the cursor type to paired dots. The movement scale of the cursor should then be changed to 1 ps to maximize the measurement accuracy. After moving the first cursor and setting it on the long trace 28 Ω line (point C), the impedance value and measure propagation delay Tpd are checked.

After moving the second cursor and setting it at a point (D) that is 5 Ω higher (i.e., 33 Ω) than the impedance value (28 Ω) of the first cursor point (C), the propagation delay Tpd is again measured. The measuring points for both the long and short traces are thereby set. In other words, the measuring points are set by adding a predetermined value to the measured impedance value. In this example, the added value is 5 Ω, although the added value does not necessarily have to be 5 Ω.

Measurement of Short Trace

The process and sequence of this measurement is identical to those for the long trace.

Calculating the Dielectric Constant

When the Tpd measurements for the long and short traces are completed, deviations of Tpd of the long and short traces are calculated for each layer. In the example shown in FIG. 6, the propagation delay Tpd deviation for the third layer is 1.366 ns. The dielectric constant of the third layer, calculated using Formula 5, is therefore 4.062. The deviation in propagation delay Tpd for the fifth layer is 1.381 ns and the calculated dielectric constant of the fifth layer is 4.151. The propagation delay Tpd deviation for the seventh layer is 1.377 ns and the dielectric constant is 4.114. Using these calculations, the average dielectric constant is 4.109 and the deviation in the dielectric constant of the layers is 0.089.

Propagation Delay Variation According to Change in PCB and RDRAM Property

Each of the RSL channels of the RIMM can be divided into an unloading section and a loading section. The unloading section includes a transmission line having a characteristic impedance of 28 Ω, while the loading section has a transmission line of higher characteristic impedance. These sections are designed to have an equivalent channel impedance of 28 Ω using a loading effect of capacitive factors when RDRAMs are mounted. In the production of PCBs, the impedances of the unloading and loading sections are designed to have specific values (e.g., 28 Ω and 41 Ω, respectively). Depending on the processing conditions, however, the actual PCBs may exhibit impedances different from their intended design values.

For example, widths of the traces may change during an etching process for the PCB traces. Also, the thickness of the dielectric material and conductors in each layer may deviate from their intended design values. Further, the content of materials constituting PCBs can cause differences in dielectric constants. These factors affect the channel impedance and can cause deviations in propagation delay in each channel. When the variation in propagation delay Tpd due to the variation of the trace impedance was examined, it was determined that the propagation delay Tpd of the RIMM has a greater effect on impedance variation of the loading section than that of the unloading section.

On the other hand, dielectric constant variation of the PCB board affects the propagation delay Tpd in two ways. First, variation in the dielectric constant directly affects the propagation delay Tpd by changing the propagation velocity on a trace. The propagation delay Tpd is also affected by impedance variation of a trace, which depends on the dielectric constant. These two effects, however, have an opposite effect on the propagation delay Tpd. For example, when the dielectric constant decreases, the propagation velocity increases and the propagation delay Tpd decreases. At the same, however, the decrease of the dielectric constant increases impedance and therefore results in an increase of propagation delay Tpd. It should be noted, however, that variation in propagation velocity has a greater effect on the variation of the propagation delay Tpd than variation in impedance. If one assumes that a change in the dielectric constant of a board does not affect the impedance but instead changes only the propagation velocity, the theoretical variation in the propagation delay Tpd ranges from about −13.6 ps to 12 ps. In actuality, however, variation in the propagation delay Tpd is smaller than the theoretical value because impedance variation counterbalances the propagation delay Tpd variation to a certain degree.

As disclosed above, it is possible to effectively measure the dielectric constant of a memory module, and, in particular, a RIMM module PCB, using existing TDR measuring instruments. Although various preferred embodiments have been disclosed herein, variations and modifications thereto will be apparent to those skilled in the art. All such variations and modifications come within the spirit and scope of this invention as set forth in the following claims.

What is claimed is:

1. A test coupon configured to measure a dielectric constant of a memory module substrate, comprising:

a first test pattern layer having an exposed surface;

a second pattern layer formed internally;

a long trace formed on each of said test pattern layers;

a short trace formed on each of said test pattern layers;

a first pair of probe pads arranged on the first test pattern layer, wherein one of the probe pads of the first pair of probe pads is connected to the long trace on the first test pattern layer and wherein the other one of the probe pads of the first pair of probe pads is connected to the short trace on the first test pattern layer;

a ground pad arranged on the first test pattern layer, said ground pad configured to be connected to a ground of power supply;

a second pair of probe pads on the first test pattern layer respectively connected to the long and short traces formed in the second test pattern layer; and a via contact electrically interconnected to the second pair of probe pads and to the long and short traces on the second test pattern layer.

2. A test coupon according to claim 1, wherein the second pair of probe pads is connected to the via contact of the second test pattern layer by via holes.

3. A test coupon according to claim 1, wherein each short trace has a length equal to or longer than about 50 mm.

4. A test coupon according to claim 1, wherein a difference in length between the long traces and the short traces is equal to or greater than about 100 mm.

5. A test coupon according to claim 1, wherein a ground layer and a dielectric layer are disposed between the first and second test pattern layers.

6. A test coupon according to claim 1, wherein the test coupon is arranged on a RIMM module board.

7. A test coupon according to claim 1, wherein the plurality of test pattern layers are made of aluminum metal patterns.

8. A method of measuring a dielectric constant of a substrate, said method comprising:

placing a test coupon having a first test pattern layer and a second test pattern layer on the substrate, the first test pattern layer comprising a first trace, a second trace that is longer than the first trace, a first probe pad connected to the first trace, a second probe pad connected to the second trace, a third probe pad, and a fourth probe pad, the second test pattern layer comprising a third trace connected to third probe pad and a fourth trace that is longer than the third trace and that is connected to the fourth probe pad;

connecting a probe tip to the probe pads of the test coupon;

adjusting a time scale and vertical scale of a measurement instrument connected to the probe tip;

reading a signal waveform by applying an input signal through the probe tip;

measuring a propagation delay of the signal and determining a first impedance value;

measuring a propagation delay value at a point higher than the first impedance value by a predetermined value;

calculating a propagation delay deviation value using the measured propagation delay values; and calculating a dielectric constant of each pattern layer using the propagation delay deviation value.

9. A method according to claim 8, wherein the first pattern layer further comprises a ground pad configured to be connected to a ground voltage, and wherein said second test pattern layer further comprises a first via contact electrically interconnected to the third probe pads and the third trace and a second via contact electrically interconnected to the fourth probe pad and the fourth trace.

10. A method according to claim 8, wherein determining the first impedance value comprises moving a first cursor on a test instrument; and wherein measuring the propagation delay value comprises moving a second cursor on the test instrument to the point higher than the impedance value of the first cursor.

11. A method according to claim 8, wherein the dielectric constant of each pattern layer is calculated using a formula wherein the dielectric constant=$[(TpcV29.8)/length]$, wherein 'Tpd' represents the propagation delay and wherein 'length' represents a propagation delay deviation between the traces of each pattern layer.

12. A method according to claim 8, wherein measuring the propagation delay is accomplished by probing the traces of each pattern layer with Time Domain Reflectometry (TDR).

13. A method according to claim 8, wherein the substrate is a RTMM module board having a plurality of RDRAMS devices.

14. A method according to claim 13, wherein the test coupon is simultaneously manufactured during a process for producing the RIMM module board.

15. A method of forming a test coupon that is configured to measure a dielectric constant of a memory module substrate, said method comprising:

forming a first test pattern layer having an exposed surface;

forming a second pattern layer internally;

forming a long trace and a short trace on each of said test pattern layers;

providing a first pair of probe pads on the first test pattern layer, wherein one of the probe pads of the first pair of probe pads is connected to the long trace on the first test pattern layer and wherein the other one of the probe pads of the first pair of probe pads is connected to the short trace on the first test pattern layer;

providing a second pair of probe pads on the first test pattern layer respectively connected to the long and short traces formed in the second test pattern layer; and forming a via contact electrically interconnected to the second pair of probe pads and to the long and short traces on the second test pattern layer.

16. A method according to claim 15, wherein the test coupon is manufactured during a process for producing a RIMM module board configured to have a plurality of RDRAM devices.

17. A method according to claim 15, further comprising forming a ground pad on the first test pattern layer, said ground pad configured to be connected to a ground of power supply.

18. A method according to claim 15, further comprising forming via holes to connect the second pair of probe pads to the via contact of the second test pattern layer.

19. A method according to claim 15, further comprising forming a ground layer and a dielectric layer between the first and second test pattern layers.

20. A method according to claim 15, wherein each short trace is formed having a length equal to or longer than about 50 mm, and wherein a difference in length between the long traces and the short traces is equal to or greater than about 100 mm.

* * * * *

UNITED STATES PATENT AND TRADEMARK OFFICE
CERTIFICATE OF CORRECTION

PATENT NO. : 6,670,816 B2
DATED : December 30, 2003
INVENTOR(S) : Kim et al.

It is certified that error appears in the above-identified patent and that said Letters Patent is hereby corrected as shown below:

Column 10,
Line 5, "=[(TpcV29.8)/length]," should read -- =[(Tpd·29.8)/length], --.
Line 13, "a RTMM module" should read -- a RIMM module --.
Line 13, "of RDRAMS devices." should read -- a RDRAM devices. --.

Signed and Sealed this

Twenty-ninth Day of June, 2004

JON W. DUDAS
*Acting Director of the United States Patent and Trademark Office*